US009284639B2

(12) United States Patent
Juliano

(10) Patent No.: US 9,284,639 B2
(45) Date of Patent: Mar. 15, 2016

(54) METHOD FOR ALKALI DOPING OF THIN FILM PHOTOVOLTAIC MATERIALS

(75) Inventor: Daniel R. Juliano, Santa Clara, CA (US)

(73) Assignee: APOLLO PRECISION KUNMING YUANHONG LIMITED, Kunming (CN)

(*) Notice: Subject to any disclaimer, the term of this patent is extended or adjusted under 35 U.S.C. 154(b) by 1730 days.

(21) Appl. No.: 12/461,053

(22) Filed: Jul. 30, 2009

(65) Prior Publication Data

US 2011/0024285 A1   Feb. 3, 2011

(51) Int. Cl.
C23C 14/24 (2006.01)
C23C 14/34 (2006.01)
C23C 14/14 (2006.01)
H01J 37/34 (2006.01)
H01L 31/0749 (2012.01)

(52) U.S. Cl.
CPC .............. *C23C 14/3414* (2013.01); *C23C 14/14* (2013.01); *H01J 37/3426* (2013.01); *H01L 31/0749* (2013.01); *Y02E 10/541* (2013.01)

(58) Field of Classification Search
CPC ............................ H01J 37/3426; C23C 14/14
USPC .............. 204/192.15, 192.26, 192.29, 298.13
See application file for complete search history.

(56) References Cited

U.S. PATENT DOCUMENTS

| | | | |
|---|---|---|---|
| 2,890,419 A | 3/1955 | Hagan | |
| 4,356,073 A | 10/1982 | McKelvey | |
| 4,536,482 A * | 8/1985 | Carcia | 502/5 |
| 4,797,332 A * | 1/1989 | Barrow et al. | 429/104 |
| 5,435,965 A | 7/1995 | Mashima et al. | |
| 5,480,695 A | 1/1996 | Tenhover et al. | |
| 5,522,535 A | 6/1996 | Ivanov et al. | |
| 5,626,688 A | 5/1997 | Probst et al. | |
| 5,744,252 A | 4/1998 | Rasky et al. | |
| 5,814,195 A | 9/1998 | Lehan et al. | |
| 5,904,966 A | 5/1999 | Lippens | |
| 5,994,163 A * | 11/1999 | Bodeg.ang.rd et al. | 438/84 |
| 6,020,556 A | 2/2000 | Inaba et al. | |
| 6,217,843 B1 * | 4/2001 | Homyonfer et al. | 423/593.1 |
| 6,300,556 B1 | 10/2001 | Yamagishi et al. | |
| 6,310,281 B1 | 10/2001 | Wendt et al. | |
| 6,372,538 B1 | 4/2002 | Wendt et al. | |
| 6,500,733 B1 | 12/2002 | Stanbery | |
| 6,525,264 B2 | 2/2003 | Ouchida et al. | |

(Continued)

FOREIGN PATENT DOCUMENTS

| | | | |
|---|---|---|---|
| JP | 60015482 A * | 1/1985 | |
| JP | 11-274534 A | 10/1999 | |
| JP | 11-298016 A | 10/1999 | |

OTHER PUBLICATIONS

Bodegård et al., "The influence of sodium on the grain structure of CuInSo₂ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.

Contreras et al., "On the role of Na and modifications to Cu(In,Ga)Se₂ absorber materials using thin-MF (M=Na, K, Cs) precursor layers," 26$^{th}$ IEEE PVSC, Anaheim, California, Sep. 30-Oct. 3, 1997, 359-362.

Devaney et al., "Recent improvement in CuInSe₂/ZnCdS thin film solar cell efficiency," 18th IEEE Photovoltaic Spec. Conf., 1985, New York, 1733-1734.

(Continued)

*Primary Examiner* — Jason M Berman
(74) *Attorney, Agent, or Firm* — The Marbury Law Group PLLC

(57) ABSTRACT

An alkali-containing transition metal sputtering target, the method of making the same, and the method of manufacturing a solar cell using the same.

18 Claims, 4 Drawing Sheets

(56) References Cited

U.S. PATENT DOCUMENTS

| | | |
|---|---|---|
| 6,559,372 B2 | 5/2003 | Stanbery |
| 6,593,213 B2 | 7/2003 | Stanbery |
| 6,690,041 B2 | 2/2004 | Armstrong et al. |
| 6,736,986 B2 | 5/2004 | Stanbery |
| 6,750,394 B2 | 6/2004 | Yamamoto et al. |
| 6,787,692 B2 | 9/2004 | Wada et al. |
| 6,797,874 B2 | 9/2004 | Stanbery |
| 6,822,158 B2 | 11/2004 | Ouchida et al. |
| 6,852,920 B2 | 2/2005 | Sager et al. |
| 6,878,612 B2 | 4/2005 | Nagao et al. |
| 6,881,647 B2 | 4/2005 | Stanbery |
| 6,936,761 B2 | 8/2005 | Pichler |
| 6,974,976 B2 * | 12/2005 | Hollars ............... 257/184 |
| 6,987,071 B1 | 1/2006 | Bollman et al. |
| 7,045,205 B1 | 5/2006 | Sager |
| 7,115,304 B2 | 10/2006 | Roscheisen et al. |
| 7,122,392 B2 | 10/2006 | Morse |
| 7,122,398 B1 | 10/2006 | Pichler |
| 7,141,449 B2 | 11/2006 | Shiozaki |
| 7,148,123 B2 | 12/2006 | Stanbery |
| 7,163,608 B2 | 1/2007 | Stanbery |
| 7,194,197 B1 | 3/2007 | Wendt et al. |
| 7,196,262 B2 | 3/2007 | Gronet |
| 7,227,066 B1 | 6/2007 | Roscheisen et al. |
| 7,235,736 B1 | 6/2007 | Buller et al. |
| 7,247,346 B1 | 7/2007 | Sager et al. |
| 7,253,017 B1 | 8/2007 | Roscheisen et al. |
| 7,259,322 B2 | 8/2007 | Gronet |
| 7,262,392 B1 | 8/2007 | Miller |
| 7,267,724 B2 | 9/2007 | Tanaka et al. |
| 7,271,333 B2 | 9/2007 | Fabick et al. |
| 7,291,782 B2 | 11/2007 | Sager et al. |
| 7,306,823 B2 | 12/2007 | Sager et al. |
| 7,319,190 B2 | 1/2008 | Tuttle et al. |
| 7,374,963 B2 | 5/2008 | Basol |
| 7,785,921 B1 | 8/2010 | Juliano et al. |
| 2005/0109392 A1 | 5/2005 | Hollars |
| 2007/0074969 A1 | 4/2007 | Simpson et al. |
| 2007/0269963 A1 | 11/2007 | Cheng et al. |
| 2007/0277875 A1 * | 12/2007 | Gadkaree et al. ............. 136/256 |
| 2007/0283996 A1 | 12/2007 | Hachtmann et al. |
| 2007/0283997 A1 | 12/2007 | Hachtmann et al. |
| 2007/0289624 A1 | 12/2007 | Kuriyagawa et al. |
| 2008/0000518 A1 | 1/2008 | Basol |
| 2008/0053519 A1 | 3/2008 | Pearce et al. |
| 2008/0142071 A1 | 6/2008 | Dom et al. |
| 2008/0308147 A1 | 12/2008 | Lu et al. |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0199894 A1 | 8/2009 | Hollars et al. |
| 2010/0133093 A1 | 6/2010 | Mackie et al. |
| 2010/0212732 A1 | 8/2010 | Schmidt et al. |
| 2010/0212733 A1 | 8/2010 | Schmidt et al. |

OTHER PUBLICATIONS

Evbuomwan et al., "Concurrent materials and manufacturing process selection in design function deployment," Concurrent Engineering: Research and Applications, Jun. 1995, 3(2):135-144.

Granath et al., "Mechanical issues of NO back contracts for $Cu(In,Ga)Se_2$ devices," 13th European Photovoltaic Solar Energy Conference, Proceedings of the International Conference, Nice, France, Oct. 23-27, 1995, Freiesleben et al. Ed., vol. II, 1983-1986.

Hedström et al., "$ZnO/CdS/Cu(In,Ga)Se_2$ thin film solar cells with improved performance," $23^{rd}$ IEEE Photovoltaic Specialists Conference, Louisville, Kentucky, May 10-14, 1993, 364-371.

Holz et al., "The effect of substrate impurities on the electronic conductivity in CIS thin films," $12^{th}$ European Photovoltaic Solar Energy Conference, Proceedings of the International Conference, Amsterdam, The Netherlands, Apr. 11-15, 1994, Hill et al. Ed., vol. II, 1592-1595.

Mickelsen et al., "High photocurrent polycrystalline thin-film CdS/$CuInSe_2$ solar cell," Appl. Phys. Lett., Mar. 1, 1980, 36(5):371-373.

Mohamed et al., "Correlation between structure, stress and optical properties in direct current sputtered molybdenum oxide films," Thin Solid Films, 2003, 429:135-143.

Probst et al., "The impact of controlled sodium incorporated on rapid thermal processed $Cu(InGa)Se_2$-thin films and devices," First WCPEC, Hawaii, Dec. 5-9, 2004, 144-147.

Ramanath et al., "Properties of 19.2% Efficiency ZnO/CdS/$CuInGaSe_2$ Thin-film Solar Cells," Progress in Photovoltaics: Research and Applications, 2003, 11:225-230.

Rau et al., "$Cu(In,Ga)Se_2$ solar cells," Clean Electricity From Photovoltaics, Series on Photoconversion of Solar Energy, vol. 1, 2001, Archer et al. Ed., Chapter 7.

Rudmann et al., "Effects of NaF coevaporation on structural properties of $Cu(In,Ga)Se_2$ thin films," Thin Solid Films, 2003, 431-432:37-40.

Sakurai at al,. "Properties of Cu(In,Ga)Se2:Fe Thin Films for Solar Cells," Mater. Res. Soc. Symp. Proc., 2005, 865:F14.12.1-F.14.12.5.

Scofield et al., "Sodium diffusion, selenization, and microstructural effects associated with various molybdenum back contact layers for Cis-based solar cells," Proc. of the $24^{th}$ IEEE Photovoltaic Specialists Conference, New York, 1995, 164-167.

So et al., "Properties of Reactively Sputtered $Mo_{1-x}O_x$ Films," Appl. Phys. A, 1988, 45:265-270.

Stolt et al., "$ZnO/CdS/CuInSe_2$ thin-film solar cells with improved performance," Appl. Phys. Lett., Feb. 8, 1993, 62(6):597-599.

Windischmann, Henry, "Intrinsic Stress in Sputter-Deposited Thin Films," Critical Reviews in Solid State and Materials Science, 1992, 17(6):547-596.

Yun et al., "Fabrication of CIGS solar cells with a Na-doped Mo layer on a Na-free substrate," Thin Solid Films, 2007, 515:5876-5879.

\* cited by examiner

METHOD FOR ALKALI DOPING OF THIN FILM PHOTOVOLTAIC MATERIALS

FIELD

The present invention relates generally to the field of photovoltaic devices, and specifically to forming thin-film solar cells by sputter depositing an alkali-containing transition metal electrode.

BACKGROUND

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, having desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY

One embodiment of the invention provides a method of manufacturing a solar cell including providing an alkali-containing transition metal target, depositing a first electrode comprising an alkali-containing transition metal layer over a substrate, wherein the step of depositing the first electrode comprises sputtering from the alkali-containing transition metal target, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer. The step of forming an alkali-containing transition metal target comprises applying a salt solution comprising an alkali metal to a target comprising a transition metal and drying the alkali-containing transition metal target.

Another embodiment of the invention provides a method of forming an alkali-containing transition metal sputtering target comprising providing a sputtering target comprising a transition metal, applying a salt solution comprising an alkali metal to the sputtering target, and drying the alkali-containing transition metal sputtering target.

Another embodiment of the invention provides an alkali-containing transition metal sputtering target comprising a sputtering target comprising a transition metal, the sputtering target having a porous structure containing a series of interconnecting channels, and an alkali metal, wherein the alkali metal forms a coating on the surface of the sputtering target.

DESCRIPTION

Figure 1:
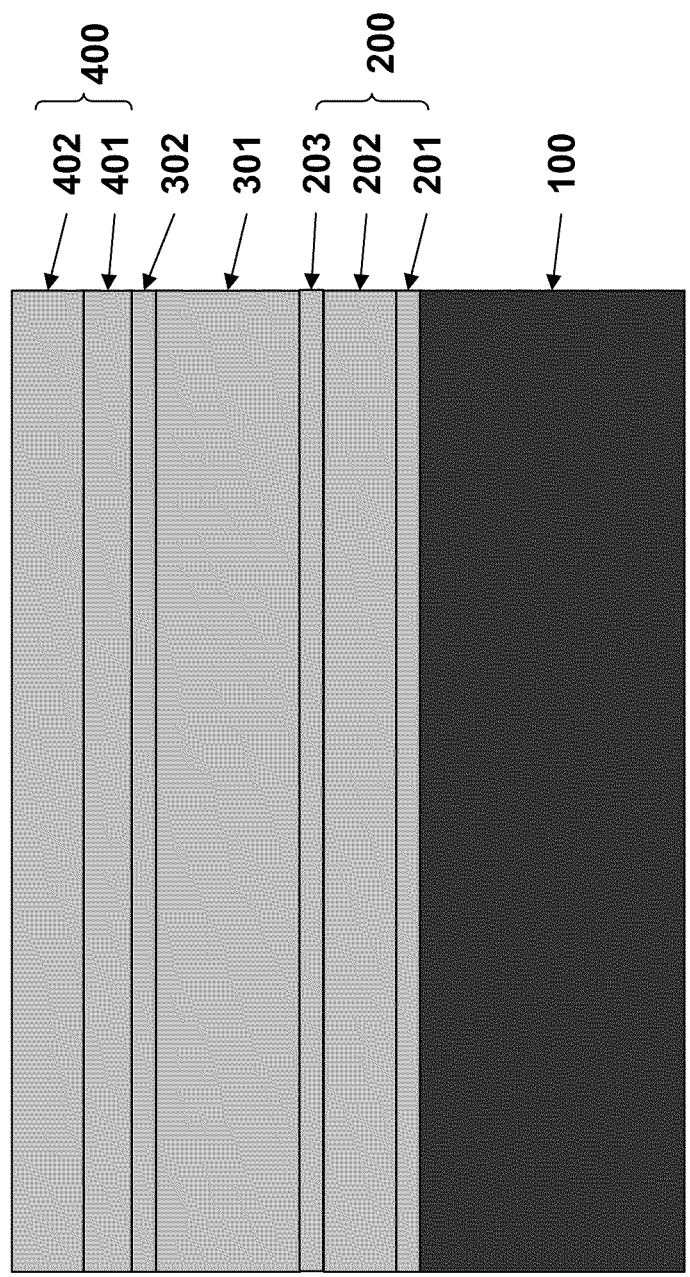
FIG. 1 is a schematic side cross-sectional view of a CIS based solar cell according to one embodiment of the invention.

As grown CIS films are intrinsically p-type doped. However, it was found that a small amount of sodium dopants in CIS films increases the p-type conductivity of the CIGS film and the open circuit voltage, and in turn, improves the efficiency of the solar cell. For example, Ramanathan (Ramanathan et al., Prog. Photovolt. Res. Appl. 11 (2003) 225, incorporated herein by reference in its entirety) teaches that a solar cell, having an efficiency as high as 19.5%, may be obtained by using a soda-lime glass substrate in combination with depositing a CIS film under a high growth temperature. This method significantly improves the efficiency of a traditional solar cell by diffusing sodium from the glass substrate into the CIS film. However, it is difficult to control the amount of the sodium provided to the CIS film and the speed of the sodium diffusion from a glass substrate. Furthermore, unlike glass substrates, other substrates, such as metal and plastic substrates, do not provide such a readily available supply of sodium.

Rudmann (Rudmann et al., Thin Solid Films 32 (2003) 37) teaches forming a NaF or NaSe layer between the CIGS layer and a first electrode (also referred as a back electrode). Sodium doping in this system can be controlled by modulating the sodium diffusion from the NaF or NaSe layer into the CIGS layer. Although the amount of sodium in CIGS may be more controllable than in the Ramanathan method, the NaF or NaSe interlayer results in a poor adhesion and a greater schottky barrier between the CIGS layer and the first electrode.

Yun (Yun et al, Thin Solid Films 515 (2007) 5876-5879) teaches DC sputtering sodium-containing molybdenum layer from a composite Na—Mo target. It has been found that resulting solar cells have an improved efficiency because the sodium incorporation enhances the open circuit voltage and fill factor. However, this method is limited by the property of the Na—Mo target, which has a high propensity to crack. Yun's method also requires a technically complicated composite target that contains a sufficiently high sodium content so as to be retained in the resulting film.

One embodiment of the invention provides a method of manufacturing a solar cell comprising providing an alkali-containing transition metal target, depositing a first electrode comprising an alkali-containing transition metal layer over a substrate, wherein the step of depositing the first electrode comprises sputtering from the alkali-containing target, depositing at least one p-type semiconductor absorber layer over the first electrode, wherein the p-type semiconductor absorber layer includes a copper indium selenide (CIS) based alloy material, depositing an n-type semiconductor layer over the p-type semiconductor absorber layer, and depositing a second electrode over the n-type semiconductor layer. The step of forming an alkali-containing transition metal target comprises applying a salt solution comprising an alkali metal to a target comprising a transition metal and drying the alkali-containing transition metal target.

One advantage of this embodiment is that the alkali-containing transition metal layer provides an alkali source that may be controllably diffused to the CIS based layer. Another advantage is that the amount of alkali in the first electrode and, in turn, in the CIS based layer can be tuned by controlling the salt deposited in the target. Furthermore, a metal selenide (not shown) may be formed at the interface of the first electrode and CIS based layer during the CIS based layer deposition or during one or more optional annealing steps after the CIS based layer deposition. This metal selenide interfacial layer improves the adhesion and provides a good ohmic contact between the alkali-containing transition metal layer and the CIS based layer.

Another embodiment of the present invention provides a method of forming an alkali-containing transition metal sputtering target comprising providing a sputtering target comprising a transition metal, applying a salt solution comprising an alkali metal to the sputtering target, and drying the alkali-containing transition metal sputtering target.

Yet another embodiment of the invention provides an alkali-containing transition metal sputtering target comprising a sputtering target comprising a transition metal, the sputtering target having a porous structure containing a series of interconnecting channels, and an alkali metal, wherein the alkali metal forms a coating on the surface of the sputtering target.

The target assembly or section of target material can be in any form factor and can have porosity below 98% dense. One preferred porosity is below 75% to 93% dense. To achieve this porosity, typical powder metallurgy processes used to consolidate the target can be used, for example, but not limited to, plasma spraying, arc spraying, uniaxial pressing, cold isostatic pressing (CIP), hot isostatic pressing (HIP), or sintering with or without a subsequent densification step.

The salt solution can be applied to the target by, for example, but not limited to, immersing a target in a salt solution, spraying a salt solution onto a target, or rolling a target in a partially filled salt solution.

The transition metal of the alkali-containing target can be one of Mo, Cr, Nb, W, V, Ta, Ti, Zr, Zn, or alloys thereof. One preferred transition metal is Mo.

The alkali metal of the alkali-containing target can be one of Na, Li, K, or a combination thereof. One preferred alkali metal is sodium, and can be in any form containing sodium, for example, sodium chloride, sodium fluoride, sodium molybdate, sodium tungstate, sodium titanate, sodium metavanadate, sodium orthovanadate, sodium hydroxide, sodium oxide, sodium fluoride, sodium selenide, sodium selenate, sodium selenite, sodium sulfate, sodium sulfide, sodium sulfite, or a combination thereof.

The solute used for the salt solution may include but is not limited to water and can be any polar solvent. Other forms of solute can be alcohols, ethers, esters, ketones, amines, aldehydes, liquid ammonia, dioxane, partially halogenated hydrocarbons, or a combination thereof.

Physical enhancements can be performed to increase the salt takeup process before and during the step of applying the salt solution. A physical enhancement can include agitation of the salt solution, such as via a mixing device immersed in the solution or the application of ultrasonic energy. Another enhancement can be an increase of the temperature of the salt solution, up to the boiling point of the solute. Yet another enhancement can be an increase of the pressure to the salt solution and the target in a pressure chamber. These elevated pressures will directly drive the salt solution deeper into the porous target, as well as increase the boiling point of the solute and allow for a higher processing temperature. Even a moderate pressure increase such as 50 psi over atmospheric pressure will effectively drive the salt solution deep into the pores of the target. Higher pressures will be even more effective, up to the very high pressures used in isostatic pressing (up to 50,000 psi).

Chemical enhancements can be performed to increase the salt takeup process during the step of applying the salt solution. A chemical enhancement can include a wetting agent added to the salt solution. Wetting agents can be a sodium sulfate, such as sodium lauryl sulfate, sodium lauryl ether sulphate, or sodium isodecyl sulfate; a sulfosuccinate, such as sodium dioctylsulfosuccinate; ammonium lauryl sulfate; a petroleum sulfonate; or any other compound which provides wetting ability to metal surfaces. Another enhancement can include subjecting the target to a vacuum in a vacuum chamber, backfilling the chamber with a gas that soluble in the solvent of choice, such as carbon dioxide in water, and applying a salt solution, preferably cold, to the target. As the gas in the pores of the target goes into solution, the solution will permeate into the pores. A soluble gas can be any gas with a solubility of greater than 1 g/kg for the solvent used at the processing temperature used.

Yet another chemical enhancement can include facilitating precipitation by: adding a component, such as solvent having a polarity lower than that of the base solvent to reduce the solubility of the salt; decreasing the temperature of the solution to a temperature below the solubility limit; or increasing the salt concentration by evaporating off excess solvent. In the example of decreasing the temperature, the target material can be cooled preferentially to enhance precipitation within the pores of the target structure. Similarly, a solvent having a polarity lower than that of the base solvent can be introduced into the target prior to introducing the salt containing solution, in order to increase the likelihood of salt precipitation within the target pores.

To accelerate the drying process of the alkali-containing target, the temperature can be increased, preferably above 100° C., but preferably not exceeding the melting point of the alkali contained in the target. For example, in the case of sodium molybdate, the target could be heated up to 687° C., the melting point of sodium molybdate. Another way to accelerate the drying process is to decrease the pressure below atmospheric pressure, preferably to the range of 0 to 0.3 atm. Elevated temperature and decreased pressure can also be combined to quickly dry the target.

After drying the target, a layer of alkali is formed on the surfaces of the target, including on the insides surfaces of the target pores. The alkali metal on the surfaces of the target is higher in concentration than the alkali metal diffused into the original target material. Preferred concentrations of the alkali are at least 10 times higher on the porous surface of the target than in the original target material.

To further achieve a desired concentration of alkali in the target, multiple cycles of depositing and drying may be performed. Also, there can be a subsequent consolidation step to increase the density of the target. Such consolidation step may comprise a hot or cold rolling, pressing, extrusion, or forging step.

One embodiment provides a solar cell having a structure illustrated in FIG. 1. The solar cell contains the substrate 100 and a first (lower) electrode 200. Optionally, the first electrode 200 of the solar cell may comprise one or more barrier layers 201 located under the alkali-containing transition metal layer 202, and/or one or more adhesion layers 203 located over the alkali-containing transition metal layer 202. In some embodiments, the barrier layer 201 is denser than the adhesion layer 203, and substantially prevents alkali diffusion from the alkali-containing transition metal layer 202 into the substrate 100. In these embodiments, alkali may diffuse from the alkali-containing transition metal layer 202, through the lower density adhesion layer 203, into the at least one p-type semiconductor absorber layer 301 during and/or after the step of depositing the at least one p-type semiconductor absorber layer 301. The optional barrier layer 201 and adhesion layer 203 may comprise any suitable materials. For example, they may be independently selected from a group consisting of Mo, W, Ta, V, Ti, Nb, Zr, Cr, TiN, ZrN, TaN, VN, $V_2N$ or combinations thereof. In one embodiment, while the barrier layer 201 may be oxygen free, the alkali-containing transition metal layer 202 and/or the adhesion layer 203 may contain oxygen and/or be deposited at a higher pressure than the barrier layer 201 to achieve a lower density than the barrier layer 201. For example, layer 202 may optionally contain 5 to 40 atomic percent oxygen and layer 203 may optionally contain 1 to 10 atomic percent oxygen.

Alternatively, the optional one or more barrier layers 201 and/or optional one or more adhesion layers 203 may be omitted. When the optional one or more adhesion layers 203 are omitted, the at least one p-type semiconductor absorber layer 301 is deposited over the alkali-containing transition metal layer 202, and alkali may diffuse from the alkali-containing transition metal layer 202 into the at least one p-type semiconductor absorber layer 301 during or after the deposition of the at least one p-type semiconductor absorber layer 301.

In preferred embodiments, the p-type semiconductor absorber layer 301 may comprise a CIS based alloy material selected from copper indium selenide, copper indium gallium selenide, copper indium aluminum selenide, or combinations thereof. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom for each one of Group III atom and each two of Group VI atoms. The step of depositing the at least one p-type semiconductor absorber layer may comprise reactively AC sputtering the semiconductor absorber layer from at least two electrically conductive targets in a sputtering atmosphere that comprises argon gas and a selenium containing gas (e.g. selenium vapor or hydrogen selenide). For example, each of the at least two electrically conductive targets comprises copper, indium and gallium; and the CIS based alloy material comprises copper indium gallium diselenide.

An n-type semiconductor layer 302 may then be deposited over the p-type semiconductor absorber layer 301. The n-type semiconductor layer 302 may comprise any suitable n-type semiconductor materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode is deposited over a substrate, followed by depositing an n-type semiconductor layer over the transparent electrode, depositing at least one p-type semiconductor absorber layer over the n-type semiconductor layer, and depositing a top electrode comprising an alkali-containing transition metal layer over the at least one p-type semiconductor absorber layer. The substrate may be a transparent substrate (e.g., glass) or opaque (e.g., metal). If the substrate used is opaque, then the initial substrate may be delaminated after the steps of depositing the stack of the above described layers, and then bonding a glass or other transparent substrate to the transparent electrode of the stack.

More preferably, the steps of depositing the first electrode 200, depositing the at least one p-type semiconductor absorber layer 301, depositing the n-type semiconductor layer 302, and depositing the second electrode 400 comprise sputtering the alkali-containing transition metal layer 202, the p-type absorber layer 301, the n-type semiconductor layer 302 and one or more conductive films of the second electrode 400 over the substrate 100 (preferably a web substrate in this embodiment) in corresponding process modules of a series of independently isolated, connected process modules without breaking vacuum, while passing the web substrate 100 from an input module to an output module through the series of independently isolated, connected process modules such that the web substrate continuously extends from the input module to the output module while passing through the series of the independently isolated, connected process modules. Each of the process modules may include one or more sputtering targets for sputtering material over the web substrate 100.

Figure 2:
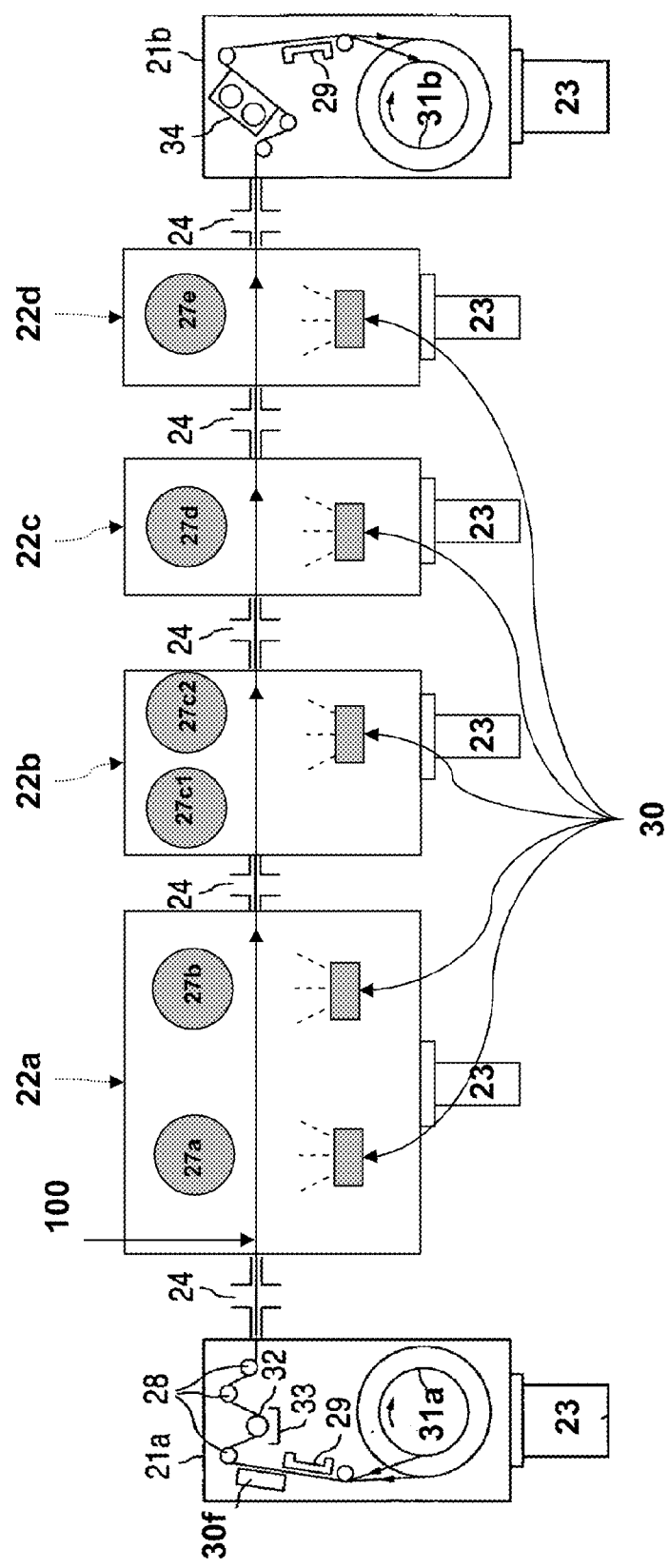
FIG. 2 shows a highly simplified schematic diagram of a top view of a modular sputtering apparatus that can be used to manufacture the solar cell depicted in FIG. 1.

For example, a modular sputtering apparatus for making the solar cell, as illustrated in FIG. 2 (top view), may be used for depositing the layers. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 2 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps or resistive heating elements laid out across the width of the web. Infrared sensors or thermocouples may provide a feedback signal to servo the heating element power and provide uniform heating across the web. In one embodiment, as shown in FIG. 2, the heaters are placed on one side of the web 100, and sputtering targets 27a-e are placed on the other side of the web 100. Sputtering targets 27 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process module 22a through valve 24. Following the direction of the imaginary arrows along the web 100, the full stack of layers may be deposited in one continuous process. The first electrode 202 may be sputtered in the process module 22a over the web 100, as illustrated in FIG. 2. Optionally, the process module 22a may include more than one target, the target comprising an alkali-containing transition metal target 27.

The web 100 then passes into the next process module, 22b, for deposition of the at least one p-type semiconductor absorber layer 301. In a preferred embodiment shown in FIG. 2, the step of depositing the at least one p-type semiconductor absorber layer 301 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 30 maintain the web at the required process temperature, for example, around 400-800° C., for example around 500-700° C., which is preferable for the CIS based alloy deposition.

Figure 3:
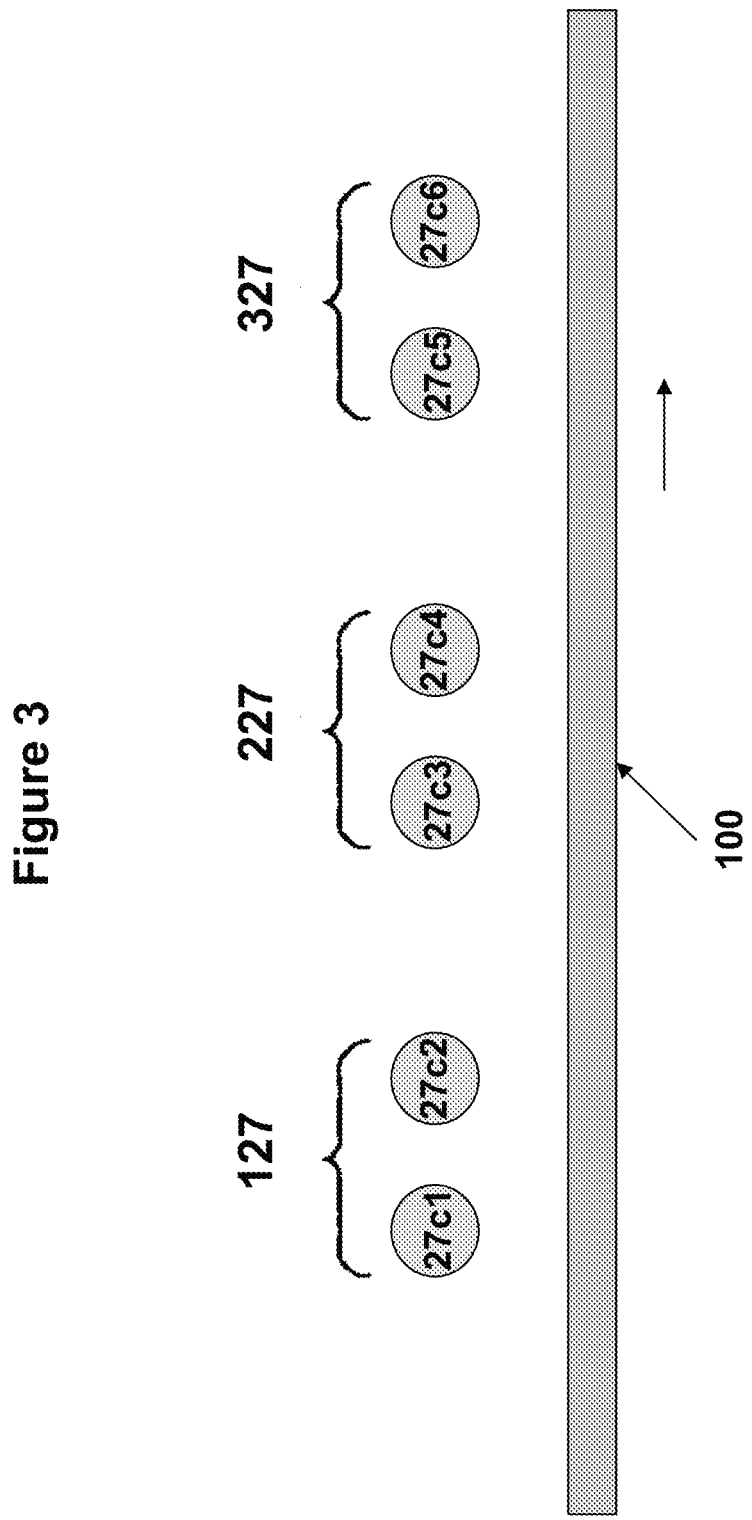
FIG. 3 illustrates schematically the use of three sets of dual magnetrons to increase the deposition rate and grade the composition of the CIS layer to vary its band gap.

In some embodiments, at least one p-type semiconductor absorber layer 301 may comprise graded CIS based material. In this embodiment, the process module 22b further comprises at least two more pairs of targets (227, and 327), as illustrated in FIG. 3. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS material is described in the Hollars published application, which is incorporated herein by reference in its entirety.

Optionally, one or more process modules (not shown) may be added between the process modules 21a and 22a to sputter a back side protective layer over the back side of the substrate 100 before the electrode 200 is deposited on the front side of the substrate. U.S. application Ser. No. 12/379,428 titled "Protective Layer for Large-Scale Production of Thin-Film Solar Cells" and filed on Feb. 20, 2009, which is hereby incorporated by reference, describes such deposition process. Further, one or more barrier layers 201 may be sputtered over the front side of the substrate 100 in the process module(s) added between the process modules 21a and 22a. Similarly, one or more process modules (not shown) may be added between the process modules 22a and 22b, to sputter one or more adhesion layers 203 between the alkali-containing transition metal layer 202 and the CIGS layer 301.

The web 100 may then pass into the process modules 22c and 22d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more AR layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

Figure 4:
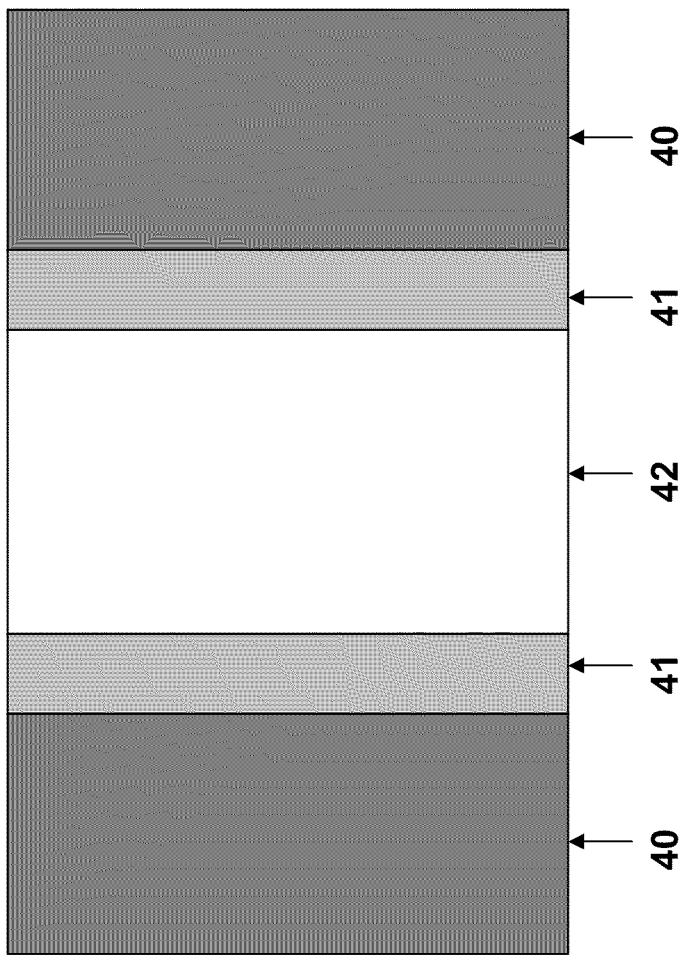
FIG. 4 shows a highly magnified cross-sectional view of a sputtering target that can be used to manufacture the solar cell depicted in FIG. 1.

FIG. 4 shows a highly magnified cross-sectional view of the sputtering target according to one embodiment of the invention. The sputtering target comprises a transition metal 40 having a porous structure with a series of interconnecting channels 42. The interconnecting channels 42 allow a salt solution comprising an alkali metal 41 to infiltrate the porous structure of the transition metal 40. When the sputtering target is dried, a layer of alkali metal 41 is formed on the surfaces of the transition metal 40 to form an alkali-containing transition metal sputtering target.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A method of forming an alkali-containing transition metal sputtering target, comprising:

providing a sputtering target comprising a transition metal;
applying a salt solution comprising an alkali metal to the sputtering target; and
drying the alkali-containing transition metal sputtering target.

2. The method of claim 1, wherein the transition metal is selected from a group consisting of Mo, Cr, Nb, W, V, Ta, Ti, Zr, and Zn.

3. The method of claim 2, wherein the transition metal comprises Mo.

4. The method of claim 3, wherein the alkali metal comprises Na and the target comprises a sodium containing molybdenum sputtering target.

5. The method of claim 4, wherein the salt is selected from a group comprises sodium chloride, sodium fluoride, sodium molybdate, sodium tungstate, sodium titanate, sodium metavanadate, sodium orthovanadate, sodium hydroxide, sodium oxide, sodium fluoride, sodium selenide, sodium selenate, sodium selenite, sodium sulfate, sodium sulfide, sodium sulfite, or a combination thereof.

6. The method of claim 2, wherein the salt solution further comprises a polar solvent.

7. The method of claim 2, wherein the step of applying further comprises agitating the salt solution.

8. The method of claim 2, wherein the step of applying further comprises increasing a temperature of the salt solution to a temperature below the boiling point of the salt solution.

9. The method of claim 2, wherein the step of applying further comprises increasing a pressure in a chamber containing the salt solution and the target up to 50,000 psi.

10. The method of claim 2, wherein the salt solution further comprises a wetting agent.

11. The method of claim 2, further comprising disposing the target in a vacuum chamber and backfilling the chamber with a soluble gas before the step of applying.

12. The method of claim 2, wherein the step of applying further comprises facilitating precipitation.

13. The method of claim 2, wherein the step of drying further comprises increasing a temperature of the target up to the melting point of the salt.

14. The method of claim 2, wherein the step of drying occurs in a vacuum.

15. The method of claim 2, further comprising repeating the steps of depositing and drying to reach a desired concentration of alkali metal in the target.

16. The method of claim 1, wherein a porosity of the target is below 75% dense.

17. The method of claim 1, wherein providing a sputtering target comprises using a powder metallurgy process to consolidate the target.

18. The method of claim 5, wherein the salt comprises sodium molybdate.

* * * * *